US011699723B1

(12) United States Patent
Romanczyk

(10) Patent No.: US 11,699,723 B1
(45) Date of Patent: Jul. 11, 2023

(54) N-POLAR III-NITRIDE DEVICE STRUCTURES WITH A P-TYPE LAYER

(71) Applicant: MONDE Wireless Inc., Goleta, CA (US)

(72) Inventor: Brian Romanczyk, Goleta, CA (US)

(73) Assignee: MONDE Wireless Inc., Goleta, CA (US)

( * ) Notice: Subject to any disclaimer, the term of this patent is extended or adjusted under 35 U.S.C. 154(b) by 0 days.

(21) Appl. No.: 17/951,203

(22) Filed: Sep. 23, 2022

Related U.S. Application Data

(63) Continuation of application No. PCT/US2022/022441, filed on Mar. 30, 2022.

(51) Int. Cl.
| | |
|---|---|
| *H01L 29/778* | (2006.01) |
| *H01L 29/20* | (2006.01) |
| *H01L 29/66* | (2006.01) |
| *H01L 29/423* | (2006.01) |
| *H01L 21/285* | (2006.01) |

(52) U.S. Cl.
CPC .... *H01L 29/2003* (2013.01); *H01L 21/28587* (2013.01); *H01L 29/42376* (2013.01); *H01L 29/66462* (2013.01); *H01L 29/7782* (2013.01); *H01L 29/7785* (2013.01); *H01L 29/7786* (2013.01)

(58) Field of Classification Search
CPC ............. H01L 29/7786; H01L 29/7787; H01L 29/7782; H01L 29/7785
See application file for complete search history.

(56) References Cited

U.S. PATENT DOCUMENTS

| | | | | |
|---|---|---|---|---|
| 2010/0102358 A1* | 4/2010 | Lanzieri | .............. | H01L 29/7785 |
| | | | | 257/E21.403 |
| 2010/0270591 A1* | 10/2010 | Ahn | .................... | H01L 29/7782 |
| | | | | 257/E21.403 |
| 2012/0025270 A1* | 2/2012 | Chang | ............... | H01L 29/66462 |
| | | | | 257/E21.403 |
| 2015/0295073 A1* | 10/2015 | Tomita | ................ | H01L 29/7781 |
| | | | | 257/76 |

(Continued)

FOREIGN PATENT DOCUMENTS

JP     2001036196 A     2/2001

OTHER PUBLICATIONS

Notification of Transmittal of the International Search Report and the Written Opinion of the International Searching Authority, or the Declaration for International Application No. PCT/US22/22441 (dated Jul. 7, 2022).

*Primary Examiner* — Grant S Withers
(74) *Attorney, Agent, or Firm* — Jenkins, Wilson, Taylor & Hunt, P.A.

(57) ABSTRACT

An N-polar III-N high-electron mobility transistor device can include a III-N channel layer over an N-face of a III-N backbarrier, wherein a compositional difference between the channel layer and the backbarrier causes a 2DEG channel to be induced in the III-N channel layer adjacent to the interface between the III-N channel layer and the backbarrier. The device can further include a p-type III-N layer over the III-N channel layer and a thick III-N cap layer over the p-type III-N layer. The III-N cap layer can cause an increase in the charge density of the 2DEG channel directly below the cap layer, and the p-type III-N layer can serve to prevent a parasitic 2DEG from forming in the III-N cap layer.

17 Claims, 12 Drawing Sheets

(56) References Cited

U.S. PATENT DOCUMENTS

| | | | |
|---|---|---|---|
| 2017/0229567 A1* | 8/2017 | Morvan | H01L 29/4236 |
| 2020/0119179 A1 | 4/2020 | Mishra et al. | |
| 2022/0069114 A1 | 3/2022 | Denninghoff et al. | |

* cited by examiner

N-POLAR III-NITRIDE DEVICE STRUCTURES WITH A P-TYPE LAYER

RELATED APPLICATIONS

This application is a continuation of and claims priority to PCT Application Serial No. PCT/US2022/022441, filed Mar. 30, 2022, the disclosure of which is incorporated herein by reference in its entirety.

TECHNICAL FIELD

The current disclosure relates to semiconductor material structures and devices, and in particular devices formed from N-polar III-Nitride layers.

BACKGROUND

III-Nitride semiconductor devices such as III-N high electron mobility transistors (HEMTs) are commonly formed from a III-N material structure grown in a group-III polar orientation (i.e., in the [0 0 0 1] direction) on a substrate. An example group-III polar III-N HEMT device 100 is shown in FIG. 1. In device 100, III-N layers 111, 112, and 113 are formed in a group-III polar orientation (i.e., in the [0 0 0 1] direction, as shown) on a suitable substrate 110 such as silicon (Si), silicon carbide (SiC), sapphire, or GaN. III-N layer 111 is a buffer layer and can be formed of AlN, AlGaN, GaN, or combinations thereof. III-N layer 112 is a channel layer, for example GaN. III-N layer 113 is a barrier layer, for example AlGaN. The composition of III-N layers 112 and 113 are selected such that a two-dimensional electron gas (2DEG) channel 120 is induced in the III-N channel layer 112 extending from the source 121 to the drain 122. A gate insulator 132 is formed over the III-N barrier layer 113, and a gate 123 is formed over the gate insulator 132. Voltages applied to the gate 123 relative to the source 121 modulate the charge in 2DEG 120 directly below the gate 123, thereby modulating the current that flows between the source 121 and the drain 122 during device operation.

A nitrogen-polar (N-polar) III-N HEMT device 200 (i.e., a device in which III-N layers 211, 213, and 212 are oriented in the [0 0 0 −1] direction over substrate 210) is shown in FIG. 2. In device 200, the III-N channel layer 212 (i.e., the layer containing 2DEG channel 220) is formed over the III-N barrier layer 213 (hence in an N-polar III-N HEMT the barrier layer is often referred to as a "backbarrier"). Gate insulator 232 can serve to reduce gate leakage, which may otherwise be more persistent in an N-polar device as compared to a group III-polar device, since in an N-polar device the III-N barrier layer (e.g., layer 213) is not between the gate 223 and the channel. In many cases, N-polar III-N devices such as device 200 can have lower contact resistance (e.g., at the source and drain contacts 221 and 222, respectively) as compared to group III-polar III-N devices such as device 100. However, other challenges in N-polar III-N technology still persist.

SUMMARY

In a first aspect, a semiconductor device includes a III-N backbarrier that includes one or more III-N layers, the one or more III-N layers of the III-N backbarrier including a first III-N layer. The device also includes a III-N channel layer over an N-face of the first III-N layer, a 2DEG channel in the III-N channel layer adjacent to an interface between the III-N channel layer and the first III-N layer, a p-type III-N layer over an N-face of the III-N channel layer, and a III-N cap layer over an N-face of the p-type III-N layer. The III-N channel layer and the III-N cap layer each have bandgaps that are less than the bandgap of the first III-N layer.

In a second aspect, a semiconductor device includes a III-N backbarrier comprising one or more III-N layers, the one or more III-N layers of the III-N backbarrier comprising a first III-N layer. The device also includes a III-N channel layer over an N-face of the first III-N layer, a 2DEG channel in the III-N channel layer adjacent to an interface between the III-N channel layer and the first III-N layer, a p-type III-N layer over an N-face of the III-N channel layer, and a III-N cap layer over an N-face of the p-type III-N layer. Adjacent to the interface between the III-N channel layer and the first III-N layer, a conduction band energy of the first III-N layer is greater than a conduction band energy of the III-N channel layer.

In a third aspect, a semiconductor device includes a III-N backbarrier comprising one or more III-N layers, the one or more III-N layers of the III-N backbarrier including a first III-N layer. The device also includes a III-N channel layer over an N-face of the first III-N layer, wherein the first III-N layer has a larger bandgap than the III-N channel layer. The device further includes a 2DEG channel in the III-N channel layer adjacent to an interface between the III-N channel layer and the first III-N layer, a p-type III-N layer over an N-face of the III-N channel layer, and an n-type III-N layer between the III-N channel layer and the p-type III-N layer.

In a fourth aspect, a semiconductor device includes a III-N backbarrier comprising one or more III-N layers, the one or more III-N layers of the III-N backbarrier including a first III-N layer. The device also includes a III-N channel layer over an N-face of the first III-N layer, the III-N channel layer including a gate region and a plurality of access regions on opposite sides of the gate region. The device further includes a 2DEG channel in the III-N channel layer adjacent to an interface between the III-N channel layer and the first III-N layer, a III-N barrier layer over an N-face of the III-N channel layer, a III-N cap layer over an N-face of the III-N barrier layer, and a p-type III-N layer. The III-N channel layer and the III-N cap layer each have bandgaps that are less than the bandgaps of both the first III-N layer and the III-N barrier layer, and the III-N barrier layer and the III-N cap layer are both over the access regions of the III-N channel layer but not over the gate region of the III-N channel layer.

Any of the devices described herein can each include one or more of the following features, either alone or in combination with one another. A bandgap of the p-type III-N layer may be less than the bandgap of the first III-N layer. A thickness of the III-N channel layer may be greater than a thickness of the p-type N layer. A thickness of the III-N cap layer may be greater than a thickness of the III-N channel layer. The device can further include a III-N barrier layer between the III-N channel layer and the p-type III-N layer, wherein the bandgaps of the III-N channel layer and the p-type III-N layer are each less than the bandgap of the III-N barrier layer. The device can further include an n-type III-N layer between the III-N channel layer and the p-type III-N layer. The n-type III-N layer can be doped with a donor at a concentration of at least $10^{16}$ cm$^{-3}$. The p-type III-N layer may be a first p-type III-N layer, and the semiconductor device may further include a second p-type III-N layer and a III-N barrier layer, and wherein the III-N barrier layer is between the first and second p-type layers. The bandgaps of the III-N channel layer, the n-type III-N layer, the first and second p-type III-N layers, and the III-N cap layer may each be less than the bandgap of the III-N barrier layer. The III-N channel layer can include a gate region and a plurality of access regions on opposite sides of the gate region, the semiconductor device can further include a source contact, a drain contact, and a gate contact, and the gate contact may be over the gate region of the III-N channel layer. The III-N cap layer may be over the access regions of the III-N channel layer but not over the gate region of the III-N channel layer. The device can further include a plurality of contacts over the N-face of the III-N channel layer, the plurality of contacts including a source contact, a gate contact, and a drain contact. The III-N channel layer can include a gate region and a plurality of access regions on opposite sides of the gate region, with the III-N cap layer over the access regions of the III-N channel layer but not over the gate region of the III-N channel layer, and the gate contact over the gate region of the III-N channel layer. The device can further include a gate insulator between the gate contact and the III-N channel layer. The thickness of the p-type III-N layer can be less than 8 nm, and the concentration of acceptors in the p-type III-N layer can be greater than $10^{18}$ $cm^{-3}$. The acceptor concentration in the p-type III-N layer may be less than the donor concentration in the n-type III-N layer. The donor concentration in the n-type III-N layer may be at least $10^{16}$ $cm^{-3}$. The device may further include a gate contact over the gate region of the III-N channel layer, wherein the p-type III-N layer is between the gate contact and the III-N channel layer. The p-type III-N layer may directly contact the III-N channel layer, the III-N barrier layer, and the III-N cap layer.

In another aspect, a method of forming a semiconductor device includes forming a III-N backbarrier on a substrate, the III-N backbarrier having a group-III face proximal to the substrate and an N-face opposite the group-III face, wherein the III-N backbarrier includes one or more III-N layers, the one or more III-N layers of the III-N backbarrier including a first III-N layer. The method also includes forming a III-N channel layer over an N-face of the first III-N layer, forming a p-type III-N layer over an N-face of the III-N channel layer, and forming a III-N cap layer over an N-face of the p-type III-N layer. The III-N channel layer and the III-N cap layer can each have bandgaps that are less than the bandgap of the first III-N layer. Furthermore, the semiconductor device can include a 2DEG channel in the III-N channel layer adjacent to an interface between the III-N channel layer and the first III-N layer.

Any of the methods described herein can each include one or more of the following features, either alone or in combination with one another. The method may include forming a recess through an entire thickness of the III-N cap layer in a gate region of the semiconductor device and depositing a gate contact over the gate region of the semiconductor device. The recess may extend through an entire thickness of the p-type III-N layer. The method may further include forming a III-N barrier layer between the III-N channel layer and the p-type III-N layer. The method may further include forming a gate insulator between the III-N barrier layer and the gate contact.

DESCRIPTION OF DRAWINGS

Like numbers in the drawings represent like elements.

DETAILED DESCRIPTION

Described herein are N-polar III-Nitride semiconductor devices that are suitable for a variety of applications, including RF electronics and power conversion. The devices each include p-type III-N layers that are configured to address various issues in device performance that may otherwise arise. As used herein, the terms III-Nitride or III-N materials, layers, devices, etc., refer to a material or device comprised of a compound semiconductor material according to the stoichiometric formula $Sc_vB_wAl_xIn_yGa_zN_a(D)_b$, where v+w+x+y+z is about 1, $0 \leq v \leq 1$, $0 \leq w \leq 1$, $0 \leq x \leq 1$, $0 \leq y \leq 1$, $0 \leq z \leq 1$, a+b is about 1, $0.9 < a \leq 1$, $0 \leq b < 0.1$, and (D) is any group-V element other than nitrogen. In a III-N transistor device, the channel through which current conducts can be contained within one or more III-N layers of the device.

Figure 1:
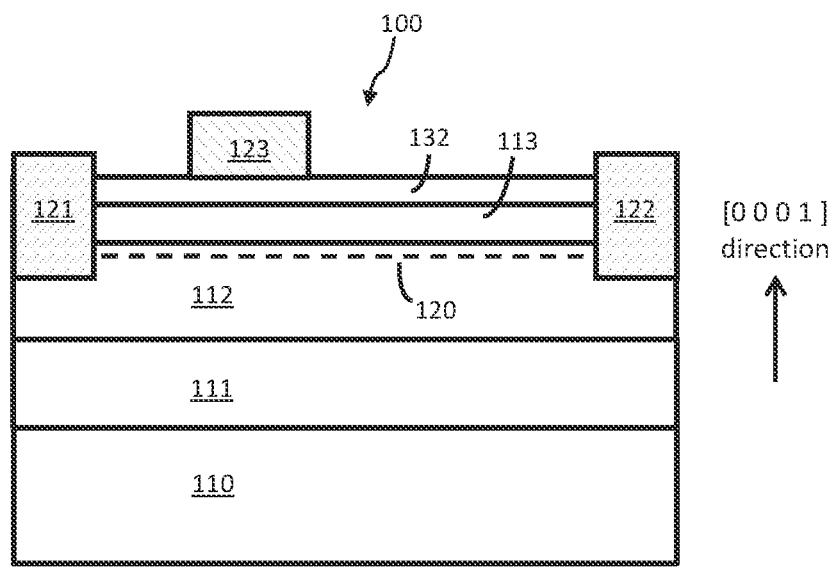
FIG. 1 is a cross-sectional view of a group-III polar III-N transistor device.
Figure 2:
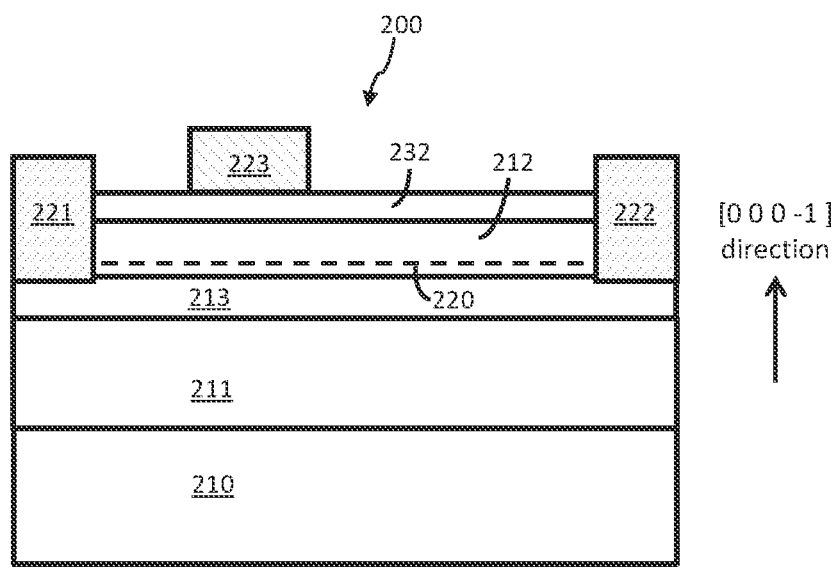
FIG. 2 is a cross-sectional view of an N-polar III-N transistor device.
Figure 3:
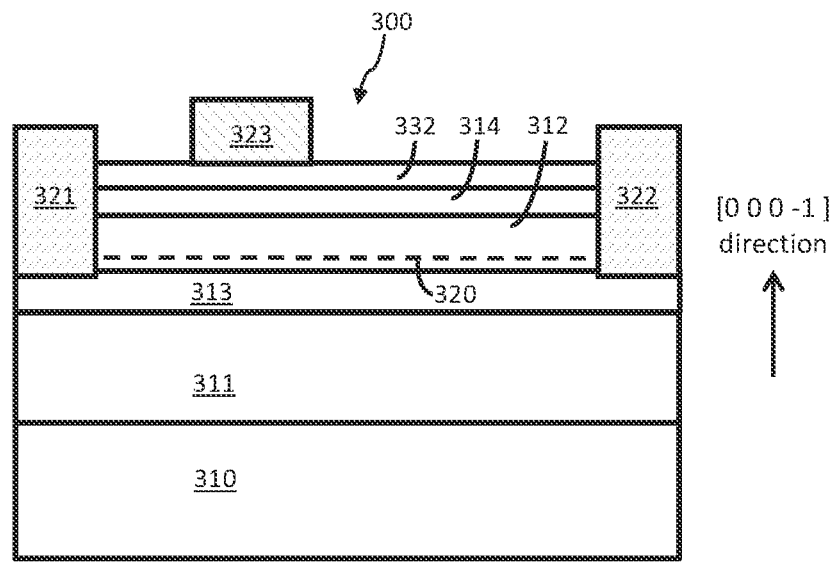
FIGS. 3-5 are cross-sectional views of various implementations of N-polar III-N transistor devices.

FIG. 3 is a cross-sectional view of an example N-polar III-N semiconductor device 300. Device 300 includes a substrate 310 and a plurality of III-N layers 311, 313, and 312 that are formed in an N-polar orientation (i.e., in the [0 0 0 −1] direction, as shown) on the substrate 310. The substrate 310 can be any substrate suitable for the epitaxial growth of III-N layers thereon, for example silicon (Si), silicon carbide (SiC), aluminum nitride (AlN), gallium nitride (GaN), or sapphire ($Al_2O_3$). III-N layer 311 is a buffer layer and can be formed of AlN, AlGaN, GaN, or combinations thereof. III-N layer 313, which is formed over an N-face of III-N buffer layer 311, functions as a backbarrier. III-N layer 312, which is formed over an N-face of III-N backbarrier 313, functions as a channel layer.

The composition of III-N backbarrier 313 and III-N channel layer 312 are selected such that a two-dimensional electron gas (2DEG) channel 320 is induced in the III-N channel layer 312 adjacent to the interface between III-N channel layer 312 and III-N backbarrier 313. In order for the 2DEG channel 320 to be induced, the compositions of III-N layers 312 and 313 can be selected such that adjacent to the interface between layers 312 and 313, the conduction band energy in III-N backbarrier 313 is greater than the conduction band energy in III-N channel layer 312. That is, at the interface between III-N layers 312 and 313, the conduction band energy can be discontinuous, with a greater conduction band energy on the backbarrier side of the interface than on the channel layer side of the interface. Such a conduction band energy discontinuity can typically be achieved by selecting a material for III-N channel layer 312 that has a smaller bandgap than that of III-N backbarrier 313. For example, III-N channel layer 312 can be formed of GaN and III-N backbarrier can be formed of $Al_xGa_{1-x}N$, where the aluminum fractional composition x can be in the range of $0.2 \leq x \leq 0.4$.

Figure 4:
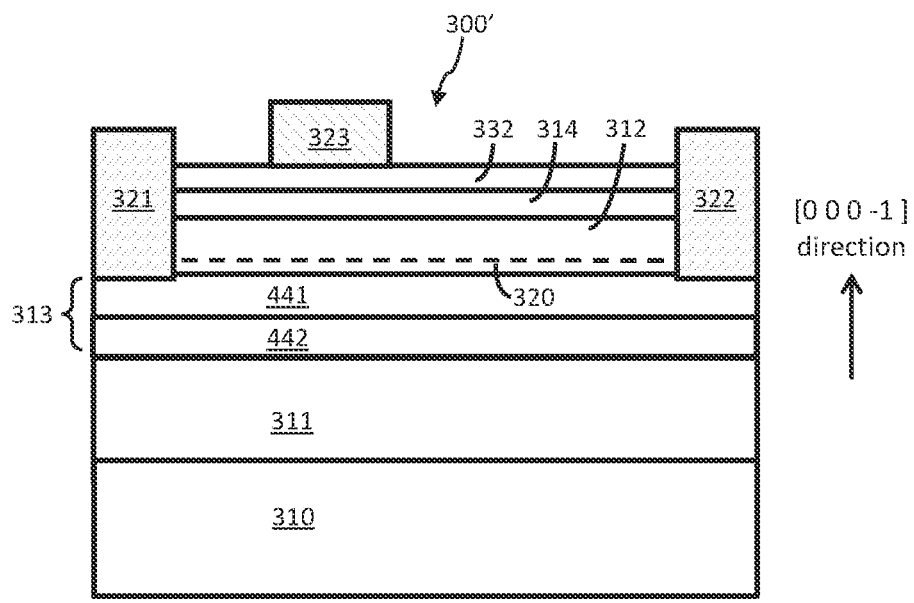

III-N backbarrier 313 can be formed as a single III-N layer or as multiple III-N layers. For example, as seen in FIG. 4, which shows an implementation 300' of the device of FIG. 3 in which backbarrier 313 is implemented as multiple III-N layers, III-N backbarrier 313 can include a first III-N layer 441 and a second III-N layer 442. In cases where III-N backbarrier 313 is formed as a single layer, the entire III-N backbarrier 313 is implemented as the first III-N layer. In cases where III-N backbarrier 313 is formed as multiple III-N layers, the first III-N layer 441 can be adjacent to and can directly contact III-N channel layer 312, such that the 2DEG channel 320 is adjacent to the interface between the III-N channel layer 312 and the first III-N layer 441 of III-N backbarrier 313. In this case, the first III-N layer 441 may have a bandgap that is greater than that of III-N channel layer 312. In some implementations, the first III-N layer 441 is formed of AlN.

Device 300 further includes a III-N barrier layer 314 over an N-face of III-N channel layer 312. III-N barrier layer 314 can be formed of a material having a greater bandgap than that of III-N channel layer 312. For example, when III-N channel layer 312 is formed of GaN, III-N barrier layer 314 can be formed of $Al_yGa_{1-y}N$, where the aluminum fractional composition y can be in the range of $0.1 \leq y \leq 0.6$. III-N barrier layer 314 can serve to reduce gate leakage in the device, and to increase the device breakdown voltage. However, III-N barrier layer 314 can also cause a decrease in the charge density of the 2DEG channel 320 due to the polarization of this layer. In order to minimize this reduction in charge density, III-N barrier layer 314 can be made thin, for example less than 10 nm, less than 8 nm, less than 5 nm, or less than 3 nm thick.

Device 300 also includes source and drain contacts 321 and 322, respectively, and a gate contact 323 between the source and drain contacts. A gate insulator 332 is optionally included between the gate contact 323 and the underlying III-N materials in order to reduce gate leakage during device operation. Voltages applied to the gate contact 323 relative to the source contact 321 modulate the charge in 2DEG 320 in the gate region of the device, thereby modulating the current that flows between the source contact 321 and the drain contact 322 during device operation. Source and drain contacts 321 and 322, respectively, are each electrically connected to the 2DEG channel 320. As used herein, two or more contacts or other items such as conductive layers or components are said to be "electrically connected" if they are connected by a material which is sufficiently conducting to ensure that the electric potential at each of the contacts or other items is intended to be the same, i.e., is about the same, at all times under any bias conditions. As used herein, the "gate region" of a device, or of one or more layers of a device, refers to the region containing the portion of the 2DEG channel that is modulated by the gate contact, which is typically directly below the gate contact. As used herein, the "contact regions" of a device, or of one or more layers of the device, are the regions directly below the source and drain contacts. As used herein, the "access regions" of the device, or of one or more layers of the device, are the regions between the gate region and the contact regions. The access region between the source contact and the gate region is typically referred to as the source access region, and the access region between the drain contact and the gate region is typically referred to as the gate access region.

Figure 5:
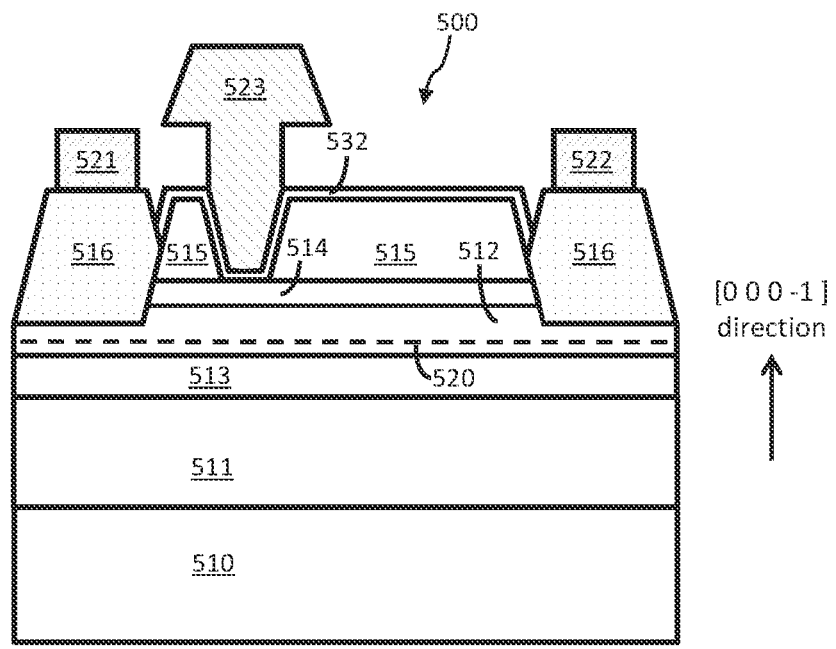

FIG. 5 is a cross-sectional view of another example N-polar III-N semiconductor device 500. Device 500 includes a substrate 510, a III-N buffer layer 511, a III-N backbarrier 513, a III-N channel layer 512, and a III-N barrier layer 514. Substrate 510 and III-N layers 511, 513, 512, and 514 can be similar to or the same as layers 310, 311, 313, 312, and 314, respectively, of device 300 of FIG. 3. Similar to the other devices described herein, the composition of III-N backbarrier 513 and III-N channel layer 512 are selected such that a 2DEG channel 520 is induced in the III-N channel layer 512 adjacent to the interface between III-N channel layer 512 and III-N backbarrier 513. The source and drain contacts 521 and 522, respectively, are formed on regrown III-N n-type regions 516, which are sufficiently conductive to cause the source and drain contacts to be electrically connected to 2DEG channel 520. However, the source and drain contacts 521 and 522, respectively, could alternatively directly contact the 2DEG channel 520, as in device 300.

Device 500 is similar to device 300 of FIG. 3, but further includes a thick III-N cap layer 515 over the access regions of III-N layers 511, 513, 512, and 514. The III-N cap layer 515 can be formed by first depositing the material of the III-N cap layer as a single layer, and then etching through the entire thickness of the III-N cap layer above the gate region and contact regions of device 500, thus leaving the material of the III-N cap layer only over the access regions. Gate insulator 532 is deposited conformally in the recess formed in the III-N cap layer 515 above the gate region of the device. Gate insulator 532 may optionally extend over the upper surface of III-N cap layer 515, as shown. Gate contact 523 is formed over gate insulator 532 above the gate region of the device in the recess formed through the III-N cap layer 515.

The III-N cap layer 515 may have a bandgap that is less than that of the III-N backbarrier 513, or less than the bandgap of the first III-N layer of III-N backbarrier 513. For example, when the III-N backbarrier 513 (or the first III-N layer of III-N backbarrier 513) is formed of $Al_xGa_{1-x}N$ ($0.2 \leq x \leq 0.4$), the III-N cap layer 515 can be formed of GaN. The III-N cap layer 515 may also have a bandgap that is less than that of the III-N barrier layer 514. For example, when the III-N barrier layer 514 is formed of $Al_yGa_{1-y}N$ ($0.1 \leq y \leq 0.6$), the III-N cap layer 515 can be formed of GaN. The III-N cap layer 515 can be undoped or unintentionally doped. The concentration of all dopants in the III-N cap layer can be less than $10^{17}$ cm$^{-3}$, less than $10^{16}$ cm$^{-3}$, or less than $10^{15}$ cm$^{-3}$.

The III-N channel layer 512 can be thin, and can, for example, have a thickness of less than 25 nm, less than 20 nm, less than 18 nm, less than 15 nm, or less than 13 nm. The III-N cap layer 515 can have a thickness that is greater than that of the III-N channel layer 512. For example, the thickness of the III-N cap layer 515 can be greater than 25 nm, greater than 30 nm, greater than 35 nm, or greater than 40 nm.

Figure 6:
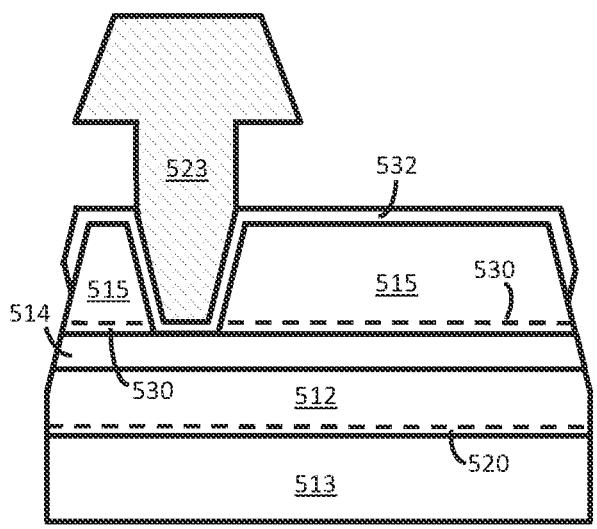
FIG. 6 is a cross-sectional view of a portion of the N-polar III-N transistor device of FIG. 5.

The III-N cap layer 515 can cause an increase in the charge density of the 2DEG channel 520 directly below the cap layer, e.g., in the device access regions, and can also mitigate the effects of DC-RF dispersion in the device by moving surface states associated with the upper surface of the III-N materials away from the 2DEG channel 520. Accordingly, the thickness of the III-N cap layer 515 can be greater than that of the III-N channel layer 512, and can, for example, be greater than 10 nm, greater than 20 nm, greater than 30 nm, or greater than 40 nm. In some implementations, the decrease in 2DEG charge density resulting from the inclusion of III-N barrier layer 514 is at least partially offset in the device access regions by inclusion of the III-N cap layer 515. This can reduce parasitic source and drain resistances in the device 500, thereby improving device performance. However, as shown in FIG. 6, which is an enlarged view of a portion of device 500, a secondary parasitic 2DEG 530 can also form in the III-N cap layer 515 due to the compositional difference between the III-N barrier layer 514 and the III-N cap layer 515 (described above), typically when the thickness of the III-N cap layer 515 is greater than about 12 nm (the exact thickness at which the parasitic 2DEG is induced depends at least in part on the compositions of the III-N barrier layer 514 and the III-N cap layer 515). This parasitic 2DEG 530 may reduce the lateral barrier between the gate and drain contacts 523 and 522, respectively, thereby increasing gate leakage in the device during operation.

Figure 7:
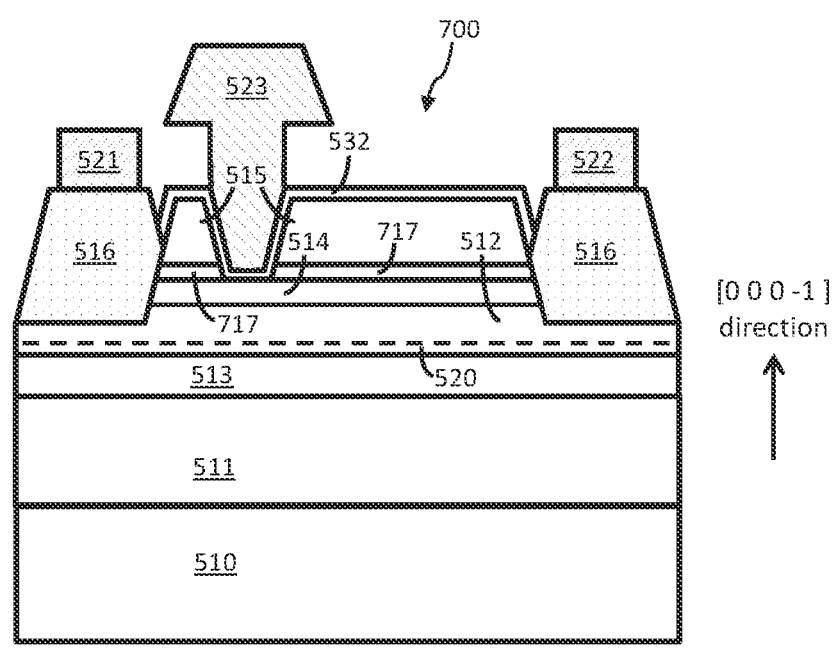
FIG. 7 is a cross-sectional view of another implementation of an N-polar III-N transistor device.

FIG. 7 is a cross-sectional view of another N-polar III-N device 700 that is similar to device 500 of FIG. 5, but further includes a p-type III-N layer 717 between III-N cap layer 515 and III-N barrier layer 514 in the device access regions (but not in the gate region). The p-type III-N layer 717 can serve to prevent the parasitic 2DEG (e.g., 2DEG 530 shown in FIG. 6) from forming in III-N cap layer 515. While this can reduce gate leakage in the device during operation, it can also result in a slight decrease in the 2DEG charge density in the device access regions, thereby increasing parasitic source and drain resistances. This decrease in the 2DEG charge density can be minimized by making the thickness of p-type III-N 717 layer very small and making the p-type doping level very high. For example, the thickness of the p-type III-N layer can be less than 10 nm, less than 8 nm, less than 6 nm, or less than 5 nm, and the concentration of acceptors can be greater than $5 \times 10^{17}$ cm$^{-3}$, greater than $10^{18}$ cm$^{-3}$, greater than $4 \times 10^{18}$ cm$^{-3}$, or greater than $8 \times 10^{18}$ cm$^{-3}$.

Figure 8:
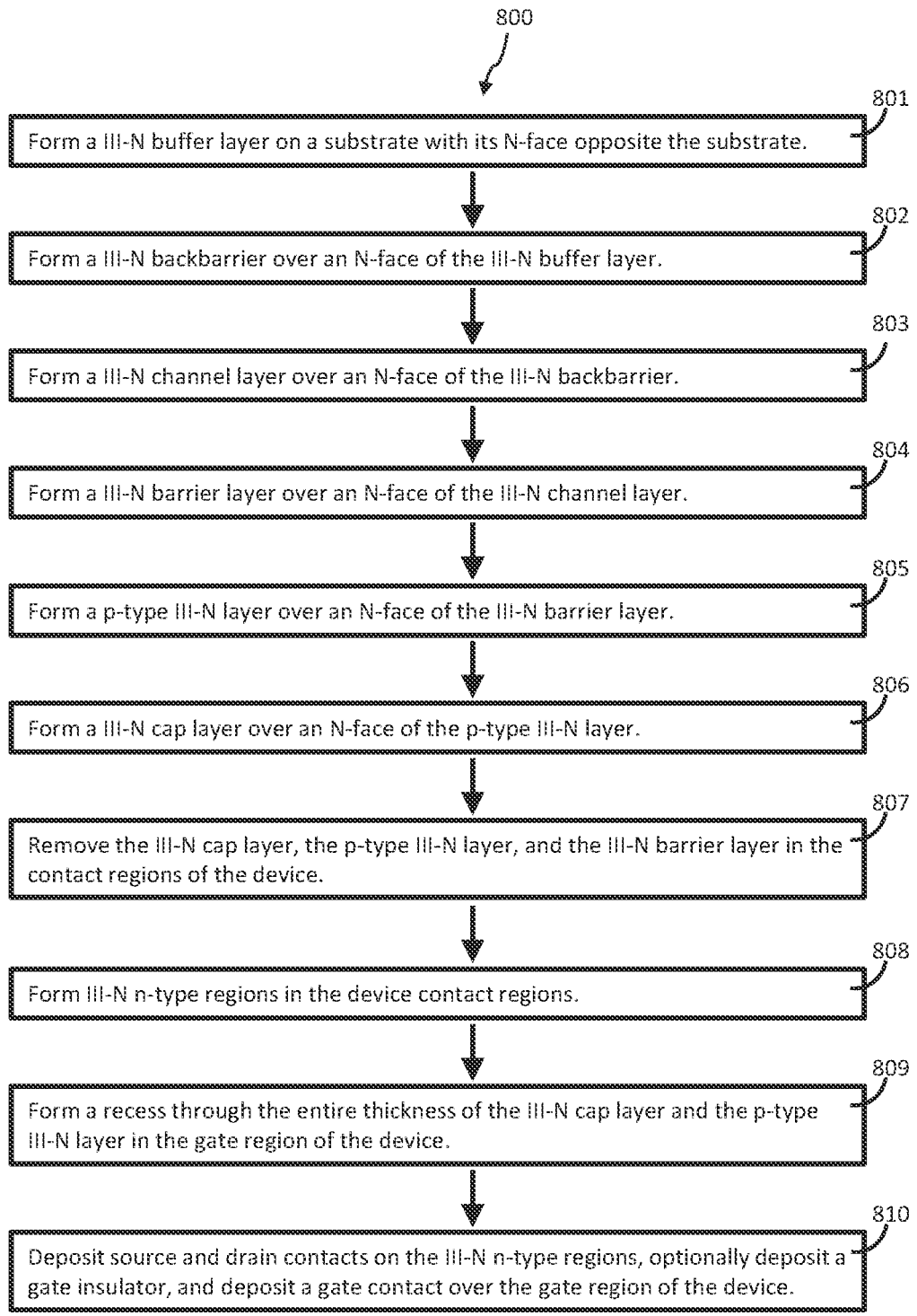
FIG. 8 illustrates a method of forming the transistor device of FIG. 7.

Device 700 of FIG. 7 can be formed according to the method 800 shown in FIG. 8. First, a III-N buffer layer (e.g., layer 511), is formed (e.g., epitaxially grown) on a substrate (e.g., substrate 510), with the N-face of the III-N buffer layer being opposite the substrate and the group-III face being adjacent to the substrate (step 801). Next, a III-N backbarrier (e.g., layer 513) is formed on the N-face of the III-N buffer layer (step 802). Next, a III-N channel layer (e.g., layer 512) is formed over an N-face of the III-N backbarrier (step 803). When III-N backbarrier is formed of multiple III-N layers and includes a first III-N layer (e.g., layer 441 in FIG. 4), the III-N channel layer can be formed over an N-face of the first III-N layer. A III-N barrier layer (e.g., layer 514) is then formed over an N-face of the III-N channel layer (step 804). Next, a p-type III-N layer (e.g., layer 717) is formed over an N-face of the III-N barrier layer (step 805), after which a III-N cap layer (e.g., layer 515) is formed over an N-face of the p-type III-N layer (step 806). Next, an etch is performed to remove the III-N cap layer 515, the p-type III-N layer 717, and the III-N barrier layer in the contact regions of the device (step 807), and a selective area epitaxial growth is performed to form III-N n-type regions 516 in the device contact regions (step 808). Next, a recess that extends through the entire thicknesses of the III-N cap layer 515 and p-type III-N layer 717 is formed via etching in the gate region of the device (step 809). To precisely control the depth of the recess, an etch that has selectivity between III-N cap layer 515, p-type III-N layer 717, and III-N barrier layer 514 may be used. That is, the etch process used to form the recess can selectively etch the material of the III-N cap layer 515 (e.g., unintentionally doped or n-type GaN) and p-type III-N layer 717 (e.g., p-type GaN) at a higher rate than the material of III-N barrier layer 514 (e.g., Al$_y$Ga$_{1-y}$N), thereby allowing the etch to stop precisely at or near the upper surface (i.e., the [0 0 0 -1] surface) of III-N barrier layer 514. Finally, source and drain contacts (e.g., contacts 521 and 522, respectively) are deposited on the III-N n-type regions 516, gate insulator 532 is optionally deposited over the III-N material layers, and gate contact 523 is deposited over the gate region of the device (step 810).

Figure 9:
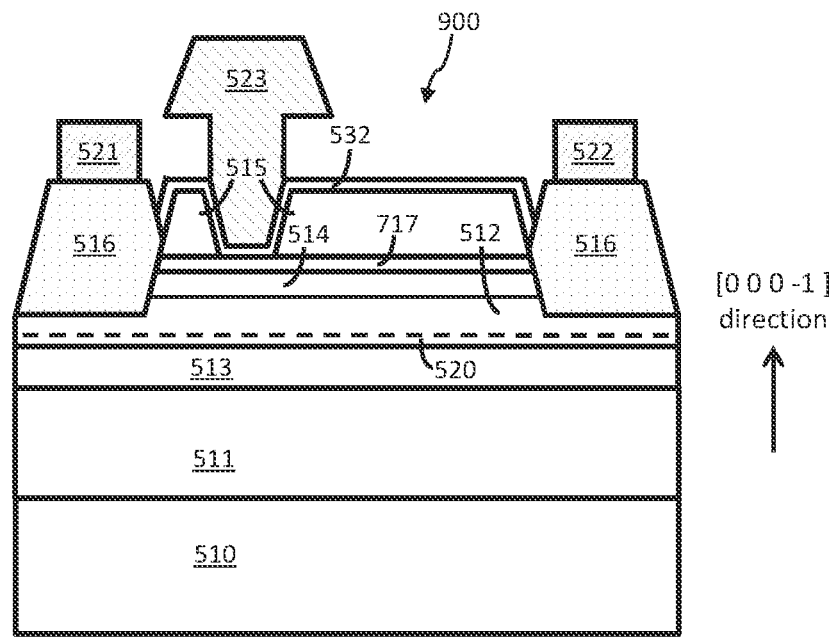
FIGS. 9-12 are cross-sectional views of other implementations of N-polar III-N transistor devices.

FIG. 9 is a cross-sectional view of another N-polar III-N device 900 that is similar to device 700 of FIG. 7, except that the p-type III-N layer 717 is also included under the gate contact 523 in the gate region of the device. Device 900 can be formed via the following modification to method 800. When the recess is formed in the gate region of the device (step 809 of method 800), the recess is formed through the III-N cap layer 515 but not through the p-type III-N layer 717. To precisely control the depth of the recess, an etch that has selectivity between III-N cap layer 515 and p-type III-N layer 717 may be used. That is, the etch process used to form the recess can selectively etch the material of the III-N cap layer 515 (e.g., unintentionally doped or n-type GaN) at a higher rate than the material of p-type III-N layer 717 (e.g., p-type GaN), thereby allowing the etch to stop precisely at or near the upper surface (i.e., the [0 0 0 -1] surface) of p-type III-N layer 717. All other steps for forming device 900 are the same as those of method 800.

Figure 10:
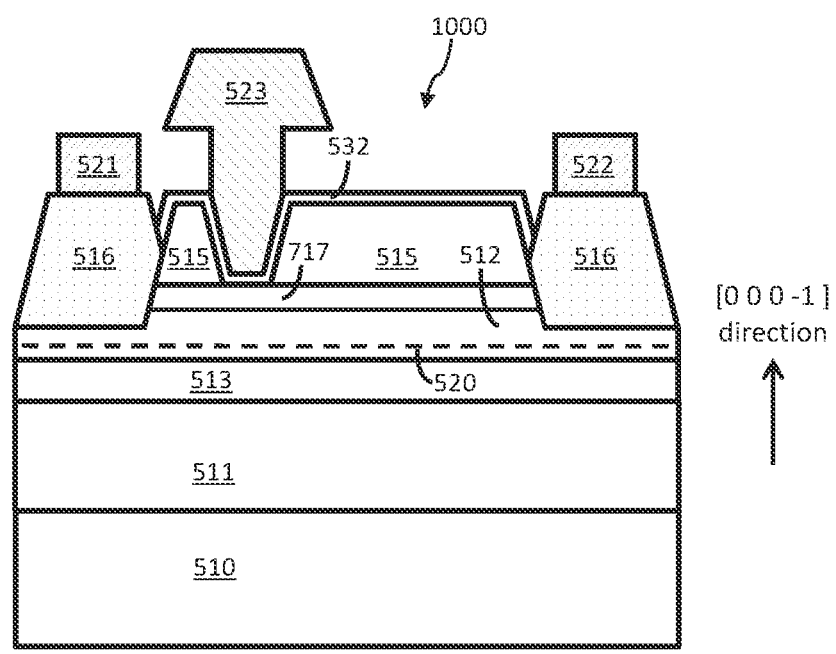

FIG. 10 is a cross-sectional view of another N-polar III-N device 1000 that is similar to device 900 of FIG. 9, except that the III-N barrier layer 514 is omitted, and the p-type III-N layer 717 is formed directly on (and over the N-face of) III-N channel layer 512. Device 1000 can be formed via the following modifications to method 800. Step 804 is omitted, and in step 805 the p-type III-N layer is instead formed over an N-face of the III-N channel layer. Additionally, when the recess is formed in the gate region of the device (step 809 of method 800), the recess is formed through the III-N cap layer but not through the p-type III-N layer. All other steps for forming device 1000 are the same as those of method 800.

Figure 11:
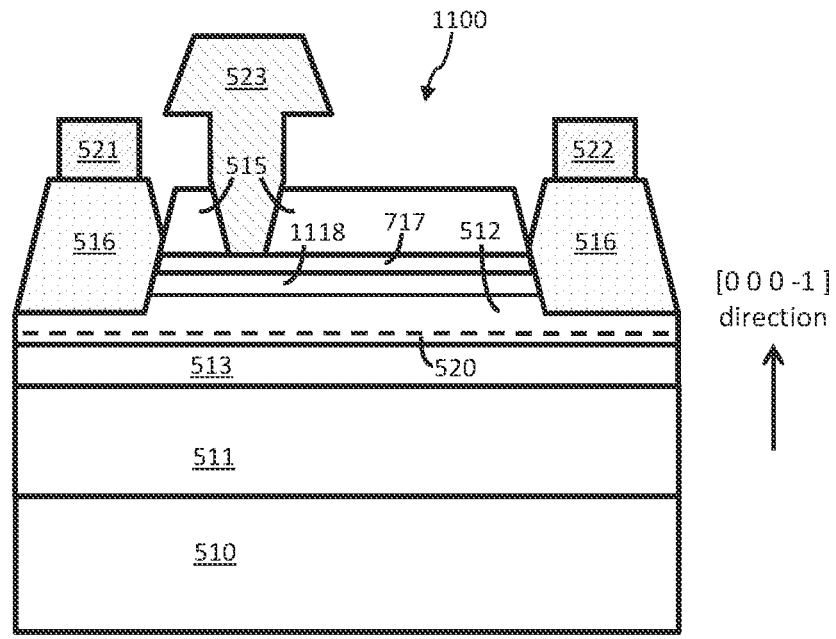

FIG. 11 is a cross-sectional view of another N-polar III-N device 1100 that is similar to device 1000 of FIG. 10, except that device 1100 further includes an n-type III-N layer 1118 between the III-N channel layer 512 and the p-type III-N layer 717, thereby forming a p-n junction in the gate region. Inclusion of the n-type III-N layer 1118 may result in an increase in the 2DEG charge density, and may at least partially offset the reduction in the 2DEG charge density that results from inclusion of the p-type III-N layer 717. Furthermore, as shown in FIG. 11, the gate insulator 532 may be omitted, such that the gate contact 523 directly contacts the p-type III-N layer 717. Accordingly, voltages applied to the gate contact 523 relative to the source contact 521 to modulate the 2DEG charge density in the gate region are applied directly to the p-type III-N layer 717, thereby modulating the voltage across the p-n junction formed by the p-type III-N layer 717 and the n-type III-N layer 1118.

When selecting the doping densities and thicknesses of the p-type III-N layer 717 and the n-type III-N layer 1118, it may be preferable to select a small thickness for each of these layers in order to maintain a large coupling between the gate contact 523 and the 2DEG channel 520 in the gate region of device 1100. Furthermore, it may be preferable that the donor density in the n-type III-N layer 1118 be large in order to increase the 2DEG charge density, but that the areal donor density in the n-type III-N layer 1118 be less than the areal acceptor density in the p-type III-N layer 717 to ensure that the n-type III-N layer 1118 is fully depleted. If n-type III-N layer 1118 is not fully depleted, there may exist a path for source-drain leakage current through the n-type III-N layer 1118 during device operation. Additionally, it may be preferably that the doping density in the p-type III-N layer be large so that the areal acceptor density in the p-type III-N layer 717 is sufficiently large to suppress the formation of a parasitic 2DEG channel in the III-N cap layer 515. As used herein, the "areal density" of a dopant (e.g., a donor or acceptor) or of a charge carrier (e.g., an electron or hole) in a material layer refers to the density of the dopant or charge carrier in the layer per unit cross-sectional area as viewed from a direction normal to the surface (or interface) of the layer. In the case that the dopant or charge carrier density is uniform throughout the layer, the areal density of the dopant or charge carrier is simply the product of the dopant/carrier density and the thickness of the layer. In the case that the dopant or charge carrier density varies over the thickness of the layer, the areal density is equal to the integral of the dopant/carrier density over the entire thickness of the layer.

In view of the above, the thickness of the p-type III-N layer 717 can be less than 20 nm, less than 15 nm, less than 12 nm, or less than 10 nm, and the concentration of acceptors can be greater than $5 \times 10^{17}$ cm$^{-3}$, greater than $10^{18}$ cm$^{-3}$, greater than $4 \times 10^{18}$ cm$^{-3}$, greater than $8 \times 10^{18}$ cm$^{-3}$, or greater than $10^{19}$ cm$^{-3}$. The thickness of the n-type III-N layer 1118 can be less than 20 nm, less than 15 nm, less than 12 nm, less than 10 nm, or less than 5 nm, and the concentration of donors can be greater than $5 \times 10^{17}$ cm$^{-3}$, greater than $10^{18}$ cm$^{-3}$, greater than $4 \times 10^{18}$ cm$^{-3}$, greater than $8 \times 10^{18}$ cm$^{-3}$, greater than $10^{19}$ cm$^{-3}$, greater than $2 \times 10^{19}$ cm$^{-3}$, or greater than $3 \times 10^{19}$ cm$^{-3}$. The areal donor density in the n-type III-N layer 1118 can be less than the areal acceptor density in the p-type III-N layer 717, e.g., less than 90%, less than 80%, less than 60%, less than 40% less than 20%, or less than 10% of the areal acceptor density in the p-type III-N layer 717. The areal donor density in the n-type III-N layer 1118 can be in a range of 10% to 99% of the areal acceptor density in the p-type III-N layer 717.

Figure 12:
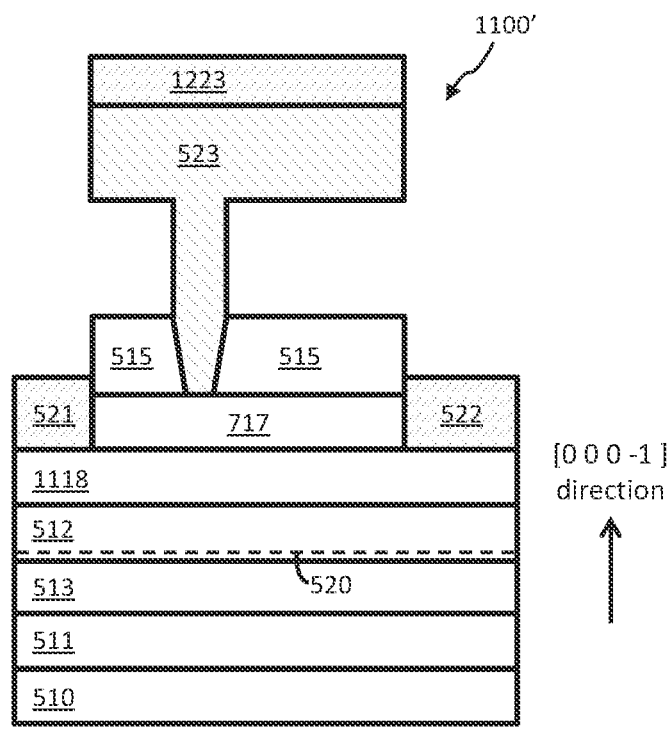

FIG. 12 is a cross-sectional view of another configuration 1100' of the device shown in FIG. 11. In configuration 1100', the III-N cap layer 515 and the p-type III-N layer 717 are both removed in the contact regions, but the n-type III-N layer 1118 is not removed in the contact regions, and the source and drain contacts 521 and 522, respectively, are directly over and contacting the n-type III-N layer 1118. Because the p-type III-N layer 717 is removed in the contact regions, n-type III-N layer 1118 is not depleted in these regions, thereby allowing for the formation of a low resistance ohmic contact for source and drain contacts 521 and 522, respectively, and allowing the source and drain contacts to be electrically connected to the 2DEG channel 520.

Figure 13A:
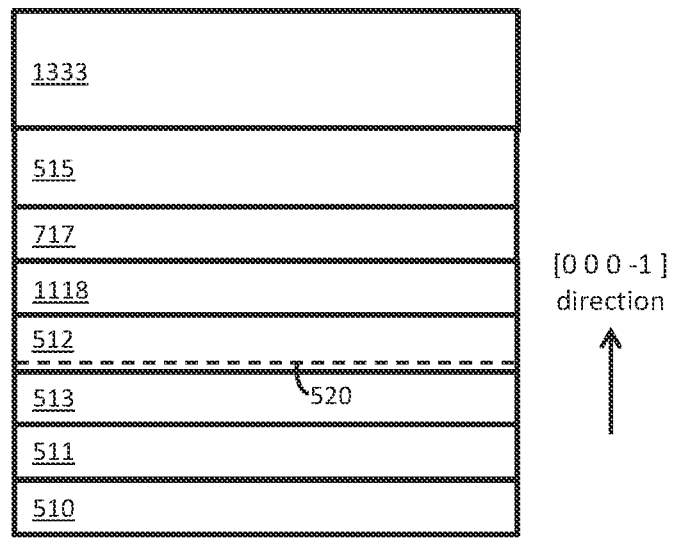
FIGS. 13A-13F illustrate a method of forming the transistor device of FIG. 12.
Figure 13B:
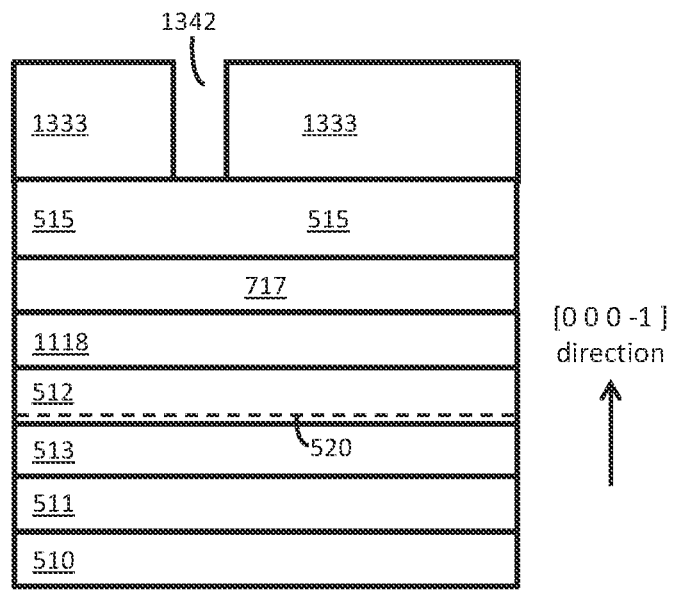
Figure 13C:
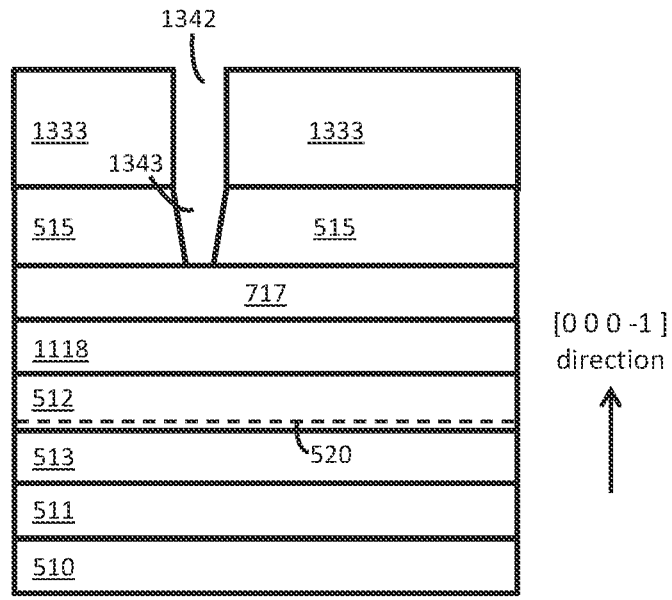
Figure 13D:
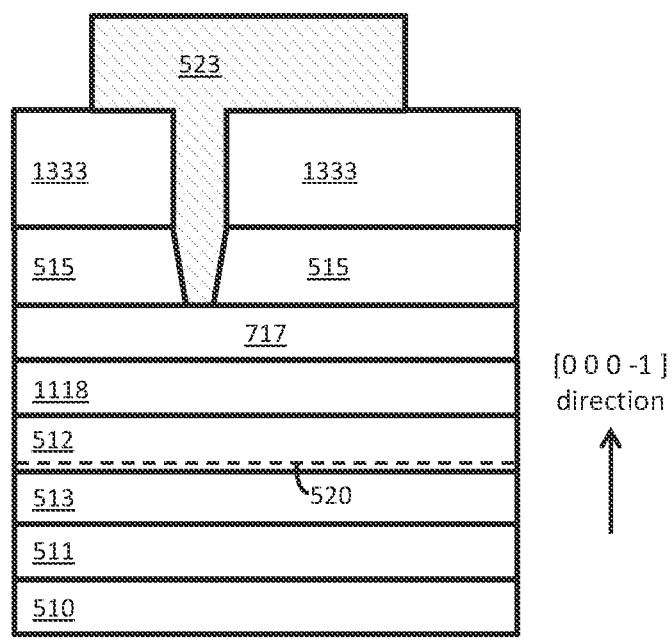
Figure 13E:
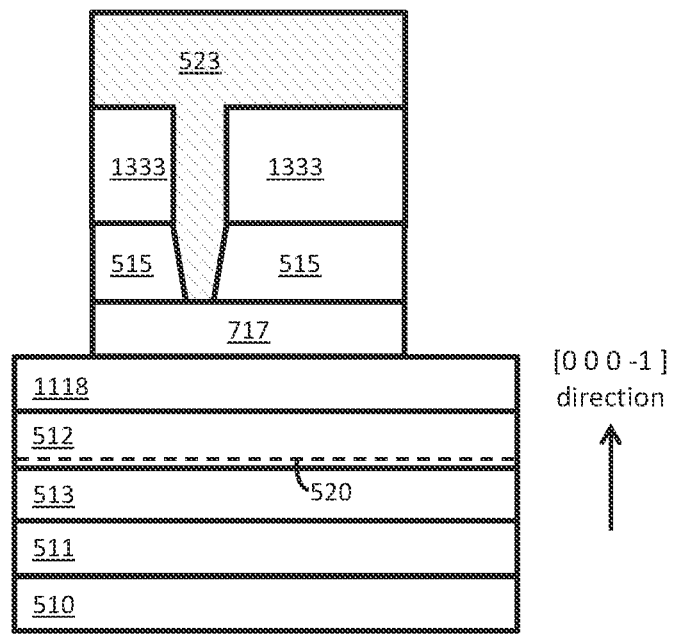
Figure 13F:
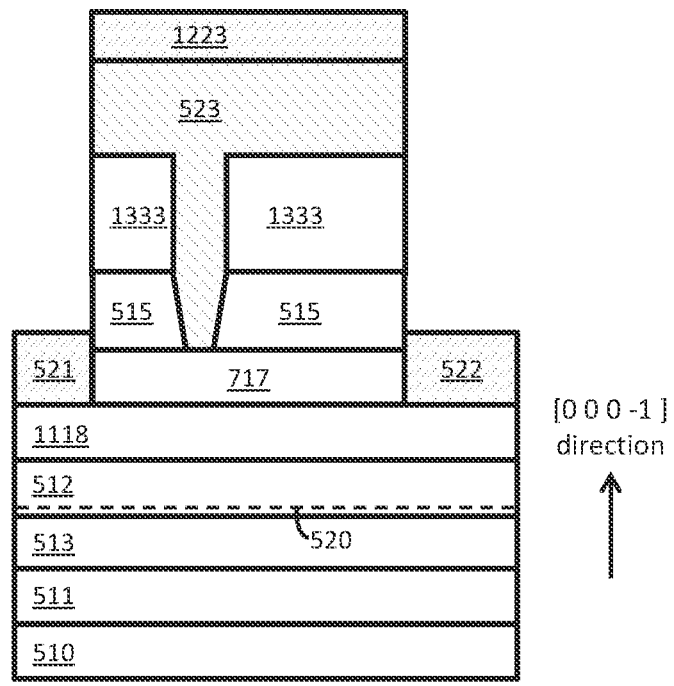

A method for forming device 1100' is illustrated in FIGS. 13A-13F. First, the various N-polar III-N layers of device 1100' (510, 511, 513, 512, 1118, 717, and 515) are formed sequentially on substrate 510, and a mask layer 1333, which can be formed of silicon dioxide (SiO$_2$) or another dielectric or polymer material, is formed over III-N cap layer 515 (FIG. 13A). Next, an aperture 1342 is etched through the mask layer 1333 (FIG. 13B). The mask layer 1333 is then used as a hard mask to form a recess 1343 in III-N cap layer 515 in the gate region of the device (FIG. 13C). The gate contact 523 is then deposited in the within the recess in III-N cap layer 515, within the aperture in mask layer 1333, and over a portion of the upper surface of mask layer 1333 (FIG. 13D). The portion of the gate contact 523 that is over the upper surface of mask layer 1333 is then used as an etch mask to remove the mask layer 1333, the III-N cap layer 515, and the p-type III-N layer 717 in the contact regions of the device (FIG. 13E). Next, a metal deposition is performed to deposit the source and drain contacts 521 and 522, respectively, and some of the source and drain metal 1223 is also deposited over the gate contact 523 (FIG. 13F). Note that with method 1300, using a line of sight deposition technique such as metal evaporation for the source and drain contacts 521 and 522, respectively, can allow these contacts to be self-aligned with respect to the gate contact 523. The thickness of the source and drain contacts 521 and 522, respectively, may be less than the combined thicknesses of layers 717, 515, and 1333 in order to prevent shorting of the source and drain contacts to the gate contact 523. Finally, the remaining portions of mask layer 1333 are removed, resulting in device 1100' of FIG. 12.

Figure 14:
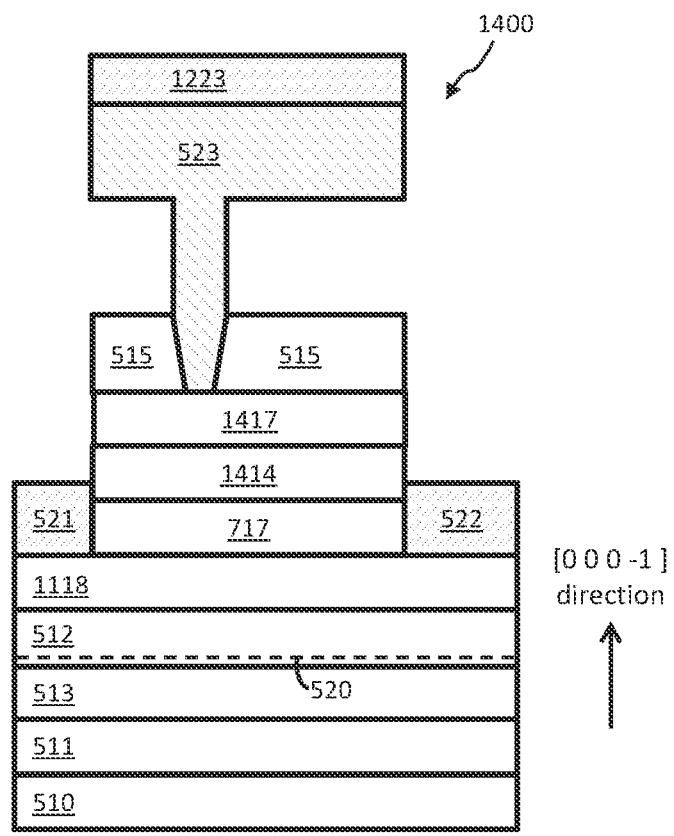
FIGS. 14-15 are cross-sectional views of other implementations of N-polar III-N transistor devices.

FIG. 14 is a cross-sectional view of another N-polar III-N device 1400 that is similar to device 1100' of FIG. 12, except that device 1400 further includes a second p-type III-N layer 1417 and a III-N barrier layer 1414 between p-type III-N layer 717 and 1417. III-N barrier layer 1414 can have a composition and thickness that is similar to or the same as III-N barrier layer 514 in FIGS. 5-7 and 9. III-N barrier layer 1414 can act as an etch stop layer during fabrication of device 1400, allowing for better process control when etching the III-N materials in the device contact regions prior to deposition of the source and drain contacts 521 and 522, respectively.

Figure 15:
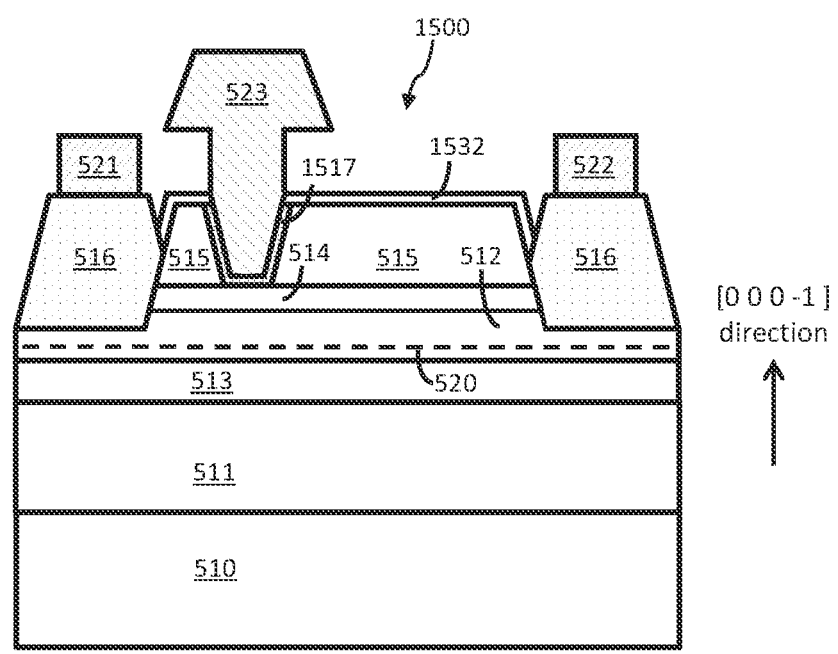

FIG. 15 is a cross-sectional view of another N-polar III-N device 1500 that is similar to device 500 of FIG. 5, except that device 1500 does not include a gate insulator between the gate contact 523 and the underlying III-N materials (e.g., III-N barrier layer 514 and III-N cap layer 515). Instead, after forming the recess through III-N cap layer 515 and III-N barrier layer 514 and forming insulator layer 1532 over the III-N materials, the material of insulator layer 1532 (which served as a gate insulator in device 500) is removed above the gate region of device 1500, and a p-type III-N layer 1517 (e.g., p-type GaN) is regrown in the gate region over the upper surface of III-N barrier layer 514 and along the sidewalls of III-N cap layer 515. The gate contact 523 is formed directly on and contacting the p-type III-N layer 1517, as shown. The regrown p-type III-N layer 1517 can have a thickness that is less than 20 nm, less than 15 nm, less than 12 nm, in the range of 2 nm to 20 nm, in the range of 2 nm to 15 nm, or in the range of 2 nm to 12 nm. The acceptor concentration in p-type III-N layer 1517 can be the same as that previously described for p-type layer 717 in device 700 of FIG. 7. Although not shown in FIG. 15, the p-type III-N layer 1517 may optionally be formed over the upper surface of III-N cap layer 515 (either between layers 515 and 1532 or in place of layer 1532), and/or p-type III-N layer 1517 may optionally be formed over III-N n-type regions 516.

Various devices and their material structures have been described above, along with methods of forming devices. However, it should be understood that they have been presented by way of example only, and not limitation. The implementations have been particularly shown and described, but it will be understood that various changes in form and details may be made. Accordingly, other implementations are within the scope of the following claims.

What is claimed is:
1. A semiconductor device, comprising:
  a III-N backbarrier comprising one or more III-N layers, the one or more III-N layers of the III-N backbarrier comprising a first III-N layer;
  a III-N channel layer over an N-face of the first III-N layer;
  a 2DEG channel in the III-N channel layer adjacent to an interface between the III-N channel layer and the first III-N layer;

a first p-type III-N layer over an N-face of the III-N channel layer;
an n-type III-N layer between the III-N channel layer and the first p-type III-N layer; and
a III-N cap layer over an N-face of the first p-type III-N layer; wherein
the III-N channel layer and the III-N cap layer each have bandgaps that are less than a bandgap of the first III-N layer;
the semiconductor device further comprises a second p-type III-N layer and a III-N barrier layer; and
the III-N barrier layer is between the first and second p-type layers.

2. The semiconductor device of claim 1, wherein a bandgap of the first p-type III-N layer is less than the bandgap of the first III-N layer.

3. The semiconductor device of claim 1, wherein a thickness of the III-N channel layer is greater than a thickness of the first p-type III-N layer.

4. The semiconductor device of claim 1, wherein a thickness of the III-N cap layer is greater than a thickness of the III-N channel layer.

5. The semiconductor device of claim 1, wherein the bandgaps of the III-N channel layer and the first p-type III-N layer are each less than a bandgap of the III-N barrier layer.

6. The semiconductor device of claim 1, wherein an acceptor concentration in the first p-type III-N layer is less than a donor concentration in the n-type III-N layer.

7. The semiconductor device of claim 1, wherein the n-type III-N layer is doped with a donor at a concentration of at least $10^{16}$ cm$^{-3}$.

8. The semiconductor device of claim 1, wherein the bandgaps of the III-N channel layer, the n-type III-N layer, the first and second p-type III-N layers, and the III-N cap layer are each less than a bandgap of the III-N barrier layer.

9. The semiconductor device of claim 1, wherein:
the III-N channel layer comprises a gate region and a plurality of access regions on opposite sides of the gate region;
the semiconductor device further comprises a source contact, a drain contact, and a gate contact; and
the gate contact is over the gate region of the III-N channel layer.

10. The semiconductor device of claim 9, wherein the III-N cap layer is over the access regions of the III-N channel layer but not over the gate region of the III-N channel layer.

11. A semiconductor device, comprising:
a III-N backbarrier comprising one or more III-N layers, the one or more III-N layers of the III-N backbarrier comprising a first III-N layer;
a III-N channel layer over an N-face of the first III-N layer;
a 2DEG channel in the III-N channel layer adjacent to an interface between the III-N channel layer and the first III-N layer;
a first p-type III-N layer over an N-face of the III-N channel layer;
an n-type III-N layer between the III-N channel layer and the first p-type III-N layer; and
a III-N cap layer over an N-face of the first p-type III-N layer; wherein
adjacent to the interface between the III-N channel layer and the first III-N layer, a conduction band energy of the first III-N layer is greater than a conduction band energy of the III-N channel layer;
the semiconductor device further comprises a second p-type III-N layer and a III-N barrier layer; and
the III-N barrier layer is between the first and second p-type layers.

12. The semiconductor device of claim 11, further comprising a plurality of contacts over the N-face of the III-N channel layer, the plurality of contacts comprising a source contact, a gate contact, and a drain contact.

13. The semiconductor device of claim 12, wherein the III-N channel layer comprises a gate region and a plurality of access regions on opposite sides of the gate region, the III-N cap layer is over the access regions of the III-N channel layer but not over the gate region of the III-N channel layer, and the gate contact is over the gate region of the III-N channel layer.

14. The semiconductor device of claim 13, further comprising a gate insulator between the gate contact and the III-N channel layer.

15. The semiconductor device of claim 11, wherein a thickness of the first p-type III-N layer is less than 8 nm, and a concentration of acceptors in the first p-type III-N layer is greater than $10^{18}$ cm$^{-3}$.

16. The semiconductor device of claim 11, wherein an acceptor concentration in the first p-type III-N layer is less than a donor concentration in the n-type III-N layer.

17. The semiconductor device of claim 11, wherein a donor concentration in the n-type III-N layer is at least $10^{16}$ cm$^{-3}$.

* * * * *